United States Patent
Gipson (10) Patent No.: US 12,259,496 B2
(45) Date of Patent: Mar. 25, 2025

(54) SYSTEM, METHOD, AND COMPONENTS UTILIZING LIVE POINT CLOUD COMPRESSION

(71) Applicants: VOLKSWAGEN AKTIENGESELLSCHAFT, Wolfsburg (DE); DR. ING. H.C. F. PORSCHE AKTIENGESELLSCHAFT, Stuttgart (DE); AUDI AG, Ingolstadt (DE)

(72) Inventor: Jerramy Lee Gipson, Willits, CA (US)

(73) Assignees: VOLKSWAGEN AKTIENGESELLSCHAFT (DE); DR. ING. H.C.F. PORSCHE AKTIENGESELLSCHAFT (DE); AUDI AG (DE)

( * ) Notice: Subject to any disclaimer, the term of this patent is extended or adjusted under 35 U.S.C. 154(b) by 704 days.

(21) Appl. No.: 17/612,244

(22) PCT Filed: May 29, 2020

(86) PCT No.: PCT/EP2020/065100
§ 371 (c)(1),
(2) Date: Nov. 18, 2021

(87) PCT Pub. No.: WO2020/240032
PCT Pub. Date: Dec. 3, 2020

(65) Prior Publication Data
US 2022/0221558 A1    Jul. 14, 2022

Related U.S. Application Data (60) Provisional application No. 62/855,523, filed on May 31, 2019.

(51) Int. Cl.
G01S 7/48     (2006.01)
G01S 17/58    (2006.01)
(Continued)

(52) U.S. Cl.
CPC ............ *G01S 7/4808* (2013.01); *G01S 17/58* (2013.01); *G01S 17/89* (2013.01); *H03M 7/6011* (2013.01); *H03M 7/70* (2013.01)

(58) Field of Classification Search
None
See application file for complete search history.

(56) References Cited

U.S. PATENT DOCUMENTS 10,345,437 B1 * 7/2019 Russell .................. G01S 17/86
2014/0270476 A1    9/2014 Cameron et al.
(Continued)

FOREIGN PATENT DOCUMENTS

WO    WO-2018035508 A1 *  2/2018 ............. G01C 21/20

OTHER PUBLICATIONS

Search Report for International Patent Application No. PCT/EP2020/065100; Aug. 13, 2020.

*Primary Examiner* — Michael J Dalbo
*Assistant Examiner* — Denise R Karavias
(74) *Attorney, Agent, or Firm* — Barnes & Thornburg LLP (57) ABSTRACT

A system for point cloud data compression including a LiDAR sensor and a compression circuit. The compression circuit receives data for rays from the LiDAR sensor, wherein the data is arranged in cells which map to corresponding rays, and each cell includes a range value. The compression circuit constructs a frame for the received data and, for each cell, determines a velocity associated with the range value for the cell, determines whether to compress the frame with respect to the cell based upon the velocity; and selectively compresses the frame with respect to the cell accordingly. Also disclosed is a system including a device (Continued)

and a server which optionally are co-located. The device gathers data about an environment which is used to generate a point cloud.

23 Claims, 3 Drawing Sheets

(51) Int. Cl.
    *G01S 17/89*     (2020.01)
    *H03M 7/30*     (2006.01)

(56) References Cited

U.S. PATENT DOCUMENTS

2017/0347100 A1    11/2017   Chou et al.
2019/0087979 A1     3/2019   Mammou et al.
2020/0333462 A1*  10/2020   Mellor ............... A63B 24/0021

\* cited by examiner

SYSTEM, METHOD, AND COMPONENTS UTILIZING LIVE POINT CLOUD COMPRESSION

PRIORITY CLAIM

The present application is a U.S. National Phase of International Patent Application No. PCT/EP2020/065100, filed May 29, 2020, which claims priority to U.S. Provisional Patent Application No. 62/855,523 filed May 31, 2019, the contents of which are hereby incorporated in their entireties.

COPYRIGHT

A portion of the disclosure of this patent document contains material which is subject to (copyright or mask work) protection (see code referenced throughout). The (copyright or mask work) owner has no objection to the facsimile reproduction by anyone of the patent document or the patent disclosure, as it appears in the Patent and Trademark Office patent file or records, but otherwise reserves all (copyright or mask work) rights whatsoever.

SUMMARY

The present disclosure relates to solutions for performing scanning LiDAR and using live point cloud compression.

While a transportation vehicle, device, or other object is driving around an area, LiDAR scan data may be collected. The LiDAR scan data may typically be split into data frames. These data frames may be registered together. Moreover, the data frames may be corrected for motion of the transportation vehicle. The result may be an accumulation of all the samples into a large point cloud. The point cloud may be used for, for example, a map, truth data, or other purposes. Data in the point cloud arising from dynamic or moving objects in the observed environment may be removed, as such data might not fit a model of a stationary environment through which the transportation vehicle is passing.

Conventional compression techniques for large point clouds may involve culling data from regions that are over-represented, such that no subsection of the cloud has more than a particular density of points. Another technique is to model surfaces in the large point cloud with partial functions, and retain the function parameters of the partial functions instead of the actual, underlying data that the function approximates. Another technique manages large point cloud maps by culling data from regions. Moreover, various techniques model parts of point clouds as surfaces.

The following presents a simplified summary to provide a basic understanding of various disclosed embodiments. The summary is not an extensive overview of the disclosure. It is neither intended to identify key or critical elements of the disclosure nor to delineate the scope of the disclosure. The following summary merely presents some concepts of the disclosure more simply as a prelude to the more detailed description below.

Disclosed embodiments relate to solutions for a system for point cloud data compression. The system may include at least one LiDAR sensor and a compression circuit. The compression circuit may be configured to receive data for rays from the LiDAR sensor. The data may be arranged in cells. The cells may be mapped to corresponding rays. Each cell may include at least a range value for a corresponding ray. The compression circuit may be configured to construct a frame for the received data. The compression circuit may be configured to, for each cell, determine a velocity associated with the range value for the cell, based upon the velocity, determine whether to compress the frame with respect to the cell, and selectively compress the frame with respect to the cell based on the determination of whether to compress the range value for the cell.

Disclosed embodiments relate to solutions for a system for point cloud data decompression. The system may include an interface configured to receive a compressed data stream and a decompression circuit. The decompression circuit may be configured to generate a reconstructed frame of data from the compressed data stream. The reconstructed frame of data may include data for rays generated by a LiDAR sensor. The data may be arranged in cells. The cells may map to corresponding rays. Each cell may include at least a range value for a corresponding ray. The decompression circuit may be configured to, for each cell, determine whether the compressed data stream indicates that the compressed data stream is compressed with respect to the cell. The decompression circuit may be configured to, based on a determination that the compressed data stream indicates that the compressed data stream is compressed with respect to the cell, reconstruct the range value for the cell in the reconstructed frame based upon a velocity associated with the range value for the cell.

Disclosed embodiments relate to solutions for methods for point cloud data compression and decompression, including operations of any of the above systems.

Disclosed embodiments relate to solutions for software for point cloud data compression and decompression. The solutions may include an article of manufacture. The article may include machine-readable instructions. The instructions, when read and executed by a processor, cause the processor to perform any of the operations or configurations of the above systems, or perform methods thereof.

DETAILED DESCRIPTION

The description of specific exemplary embodiments is not intended to be limiting of the present disclosure. To the contrary, those skilled in the art should appreciate that there are numerous variations and equivalents that may be employed without departing from the scope of the present disclosure. Those equivalents and variations are intended to be encompassed by the present disclosure.

In the following description of various exemplary embodiments, reference is made to the accompanying drawings, which form a part hereof, and in which is shown, by way of illustration, various exemplary embodiments in which the disclosure may be practiced. It is to be understood that other embodiments may be utilized and structural and functional modifications may be made without departing from the scope and spirit of the present disclosure.

Disclosed embodiments may address technical problems impeding the use of LiDAR sensors, in particular, for compression of data generated by LiDAR sensors such as compression of point clouds. Such compression may be performed live, while the LiDAR sensor is gathering data. Such compression could provide a great benefit to sensing and perception systems in that less data might need to be stored or transmitted while a device is moving and scanning an environment using LiDAR sensors. LiDAR sensors for scanning an environment around a transportation vehicle or other vehicles are increasingly more accurate and, as a result, generating more and more data points. In particular, flash LiDAR sensors can generate a large number of points at a high resolution (such as at 1024×768 pixels) at a high frequency (such as sixty Hertz). This may result in the generation of, for example, 47 million points of data per second. A pixel sample may typically contain eight or more bytes, resulting in nearly four gigabits per second of throughput demand, which is greater than even gigabit Ethernet or USB3 can provide. As such sensors become more widely used, handling such a large volume of data may become difficult. Thus, disclosed embodiments may provide a compression solution for the generation and the storage of such data.

Moreover, disclosed embodiments may address or avoid technical problems created by culling data points in regions that are over-represented. In such culling techniques, regions of data that are over-represented may be removed such that no section has more than a particular density of points. However, such techniques do not correctly represent dynamic objects such as moving cars, pedestrians, or swaying trees, as these objects are generally removed early in the accumulation of data, and data is only processed after a large amount of data has been gathered, and compression then occurs.

Furthermore, disclosed embodiments may address or avoid technical problems created by solutions that require modelling the surface of dynamic objects. A dynamic object may require combining results from multiple scans. However, initially it is unclear how many of such scans are needed to be combined to represent the object. Also, the object might not have the same shape from frame to frame, such as a pedestrian who is walking and moving his/her arms and legs. Combining scans of the dynamic object for a higher resolution model to, for example, model the surface with parameters or decide which points to cull, may require the dynamic object to first be segmented from the scene.

In addition, disclosed embodiments may address or avoid technical problems created by approaches to LiDAR data compression that focus on reducing the storage footprint of a map by modelling a stationary environment. Disclosed embodiments are capable of handling dynamic elements within the environment. Disclosed embodiments may address or avoid technical problems created by treating the data as an image and using image compression that are otherwise used for video compression in other applications. Such image compression introduces artifacts. While such artifacts may be acceptable for video viewed by humans, they cause inaccuracies that are unsuitable for range data to be used by machine intelligence or mapping.

The disclosed embodiments instead manage the data as a 2-D array similar to an image, considers the data as a spatial range, and holds errors for each sample within a certain physical range. This differs from other approaches that treat data as multiple scans of a single complex rigid object (mapping), or treat the data as video for human consumption. The disclosed embodiments consider the range values that are presented in each scan cell as an independent signal, and accounts for whether such independent signals vary over time in a predictable way or greatly vary.

Disclosed embodiments provide an approach described herein that applies to data from LiDAR sensors which generated dense scans of the environment. In the approach of the disclosed embodiments, the angle of each cell in the scan might not change from frame to frame, and thus the same angle may be sampled in each frame. Disclosed embodiments might also be able to utilize data from sensors with dense scans that do not use repeating angles if the samples for a frame are first interpolated into a grid, which does have fixed angles.

In disclosed embodiments, for a given data frame and associated sample of cells, a bit array may be kept wherein each cell may be represented by a bit. The bit may indicate whether a fresh sample data has been retained and is presented for the cell, or if the cell will be instead estimated from previous samples for the cell. The data of the first two such frames may be retained, since two samples are required to estimate the contents of a third cell. The estimation of a given cell may be based upon velocity. For frames that follow, the most recently retained samples for a given cell may be used to extrapolate an expected value for the given cell at the new sample time. If the difference between of the sample at the new sample time and the extrapolated estimate is less than some threshold, then the actual data might not be kept. A bit of the bit array may be set so as to indicate that the data is not retained and is to be instead estimated from previous samples for the cell. Otherwise, the sample may be kept (as it includes data that was not predicted), used along with the previously retained sample, to make future extrapolations, and a bit of the bit array may be set to as to indicate that the data is retained.

The threshold level between the difference between the sample and the extrapolated estimate should be sufficiently above any noise. This may be characterized in a stationary scene or test, wherein most cells can use propagated values for the majority of the time. If the noise level is too high, a poor version of extrapolated data may be created. To counteract such a phenomena, smoothing may be applied to the data, before it is compressed, to keep the noise level low. In at least one disclosed embodiment, if a most accurate or more accurate result is needed for a given data rate, the threshold can be adjusted and managed by a control loop. The control loop may adjust the threshold such that a desired number of new points each frame is retained. The error for each cell can be computed and so as to characterize performance on the basis of a given fixed number of samples of data that are to be retained.

Exemplary embodiments of the present disclosure may include systems for point cloud data compression and point cloud data decompression. The systems may be subsystems of a larger system, or may be independent systems.

According to a first exemplary embodiment, a system for point cloud data compression is provided. The point cloud data may be generated from any suitable source, such as a LiDAR sensor. Point cloud data may include data that represents objects or space. The point cloud may include any suitable data, such as range data or intensity data. The point cloud may include angle or azimuth information for a ray of the sensor.

According to the disclosed system, the system may include any suitable number and kind of LiDAR sensors. Furthermore, the system may include a compression circuit. The compression circuit may be implemented in any suitable manner, such as by analog circuitry, digital circuitry, instructions for execution by a processor, or any combination thereof.

According to the disclosed system, the compression circuit may be configured to compress data generated by the LiDAR sensor. The compression circuit may be configured to receive data for rays from the LiDAR sensor. The rays may be a logical line emitted from the LiDAR sensor and sampled along an angle in a three-dimensional view from the LiDAR sensors. In at least one disclosed embodiment, the data may be arranged in cells. The cells may be arranged in any suitable array or data structure. Each cell may be mapped to a corresponding array. Each cell may include data, such as a range value or intensity, for a corresponding ray.

According to the disclosed system, the compression circuit may be further configured to construct a frame for the received data. According to the disclosed system, the compression circuit may be further configured to, to construct the frame, for each cell, determine a velocity associated with the range value for the cell.

The velocity may be a velocity based upon repeated measurements of the range value for the cell. The range value measurements may each reflect a position in time. The range value measurements may have an associated timestamp. The velocity may be determined by dividing a difference of subsequent range values over a difference of the time at which the range values were sampled.

According to the disclosed system, the compression circuit may be further configured to, based upon the velocity, determine whether to compress the frame with respect to the cell. The determination of whether to compress the frame may include determining an expected value of the cell. The expected value may be, for example, an expected value of the range value. The expected value may be determined by a projection or extrapolation of prior data values of the range value for the same cell. More specifically, in at least one disclosed embodiment the expected value may be determined using the velocity of the range value of the cell. The velocity of the range value of the cell may be applied to the previous data values to obtain the expected data value. More specifically, the expected value may be the most recent, yet prior, data range value plus the velocity times the difference between the present time and the time of the most recent, yet prior, data range value. The expected value may represent a data range value that tracks preexisting data range value changes.

According to the disclosed system, the compression circuit may be further configured to selectively compress the frame with respect to the cell based on the determination of whether to compress the range value for the cell. The selective compression may be, for example, a decision of whether to compress the frame with respect to the cell or to not compress the frame with respect to the cell. The determination of whether to compress the frame with respect to the cell may be based upon a comparison between the expected value and the actual value of the frame. If the expected value and the actual value are sufficiently different, this may be a case where data has not tracked the preexisting data range value changes. The degree to which the values are sufficiently different may be defined by, for example, three percent difference or any other suitable difference. In at least one disclosed embodiment, allowing greater differences may yield more compression of data but less accuracy. In another disclosed embodiment, restricting the differences to smaller values may yield less compression of data but more accuracy.

According to the disclosed system, compression of the frame with respect to the cell may include removing the data of the cell from the data to be sent. A bit mask or any other suitable indicator, data structure, or control mechanism may be cleared to indicate that the data of the cell will be compressed. Otherwise such a bit mask may be set to indicate that the data of the cell will not be compressed. Such data may be added up an update list. The update list may be implemented by any suitable data structure, and may include data values for cells that are not compressed. The update list and bit mask may be sent to a recipient in lieu of the frame. The update list and bit mask may together be a compressed data stream based upon the frame. The compressed data stream may be issued to any suitable recipient through any suitable medium, such as to a local, portable storage, over a network, or transmitted through an antennae.

According to an exemplary embodiment of the system, the compression circuit is further configured to determine the velocity associated with the range value for the cell based upon two or more prior data samples of range values for the cell.

According to an exemplary embodiment of the system, and in combination with any of the above disclosed embodiments, the compression circuit is further configured to determine a projected value for the range value for the cell using the velocity associated with the range value for the cell.

According to an exemplary embodiment of the system, and in combination with any of the above disclosed embodiments, the compression circuit is further configured to compare the projected value for the range value with the range value and, based on the comparison, determine whether to compress the range value for the cell.

According to an exemplary embodiment of the system, and in combination with any of the above disclosed embodiments, the compression circuit is further configured to: determine to not compress the range value for the cell based on a determination that the range value is not within a specified threshold to the projected value. According to an exemplary embodiment of the system, and in combination with any of the above disclosed embodiments, the compression circuit is configured to determine to compress the range value for the cell based on a determination that the range value is within a specified threshold to the projected value.

According to an exemplary embodiment of the system, and in combination with any of the above disclosed embodiments, selectively compressing the range value for the cell includes omitting the range value for the cell from a data transfer. According to an exemplary embodiment of the system, and in combination with any of the above disclosed embodiments, selectively compressing the frame with respect to the cell includes constructing the frame with no data of the cell, and setting information indicating that the data of the cell is not included in the frame and is to be inferred by prior data.

According to a first exemplary embodiment, a system for point cloud data decompression is provided. The system may include an interface configured to receive a compressed data stream. The compressed data stream may include any of the compressed data streams described above. The interface may include any suitable mechanism for receiving or reading the compressed data stream, such as from a local, portable storage, over a network, or received through an antennae. The compressed data stream may include any suitable format of data. The compressed data stream may include a bit mask and update list as discussed above. The bit mask may define which cells in a frame of samples are compressed or not.

According to the disclosed system, a decompression circuit may be included. According to the disclosed system, the decompression circuit may be configured to generate a reconstructed frame of data from the compressed data stream. The reconstructed frame of data may reconstruct the frame of data collected by sensors, discussed above. The reconstructed frame may include data for a plurality of rays generated by a LiDAR sensor. The data may include range data and intensity data, or any other suitable data. The data may be arranged in cells. The cells may map to corresponding rays. Each cell may include at least a range value for a corresponding ray.

According to the disclosed system, the decompression circuit may be configured to, for each cell, determine whether the compressed data stream indicates that the compressed data stream is compressed with respect to the cell. The determination of whether the compressed data stream indicates compression for the cell may be made in any suitable manner. The determination may be based upon accessing the bit mask or other indicator to determine whether the cell is compressed. The value of the bit mask may indicate whether the cell is compressed.

According to the disclosed system, the decompression circuit may be configured to, for each cell, update a set of decompression data. The decompression data may include cells for each cell of the frame to be reconstructed. The decompression data may include, in each cell, two or more copies of the data such as range data and intensity, representing successive prior samples of such data during previous iterations of operation of the system. The decompression data may include, in each cell, time stamps associated with the data values.

According to the disclosed system, the decompression circuit may be configured to, for each cell, if the cell is compressed, maintain the values in the cell of the decompression data. According to the disclosed system, the decompression circuit may be configured to, for each cell, if the cell is not compressed, update the values in the cell of the decompression data with data that arrived with the compressed data stream. The data that arrived may be stored in, for example, the update list. Older data in the cell of the decompression data may be removed.

According to the disclosed system, the decompression circuit may be configured to, for each cell, based on a determination that the compressed data stream indicates that the compressed data stream is compressed with respect to the cell, reconstruct the range value and intensity for the cell in the reconstructed frame based upon a velocity associated with the range value for the cell. According to the disclosed system and in combination with any of the above disclosed embodiments, the decompression circuit may be configured to, for each cell, based on a determination that the compressed data stream indicates that the compressed data stream is not compressed with respect to the cell, set the range value for the cell in the reconstructed frame with a received range value in the compressed data stream.

According to the disclosed system and in combination with any of the above disclosed embodiments, the decompression circuit may be configured determine the velocity associated with the range value for the cell based upon two or more prior data samples of range values for the cell. The velocity may be analogous to the velocity found in the compression circuit.

According to the disclosed system and in combination with any of the above disclosed embodiments, for a given cell for which the compressed data stream indicates that the data stream is compressed with respect to the cell, the compressed data stream does not include data for the range value of the given cell.

According to the disclosed system and in combination with any of the above disclosed embodiments, determining whether the compressed data stream indicates that the compressed data stream is compressed with respect to the cell includes determining from a mask whether the compressed data stream includes the range value of the cell.

According to the disclosed system and in combination with any of the above disclosed embodiments, reconstructing the range value for the cell in the reconstructed frame includes, determining two or more prior data values for the cell, calculating the velocity based upon the two or more prior data values for the cell, and extrapolating a most recent data of the two or more prior data values for the cell based upon the velocity and a time at which the most recent data of the two or more prior data values was taken.

Figure 1:
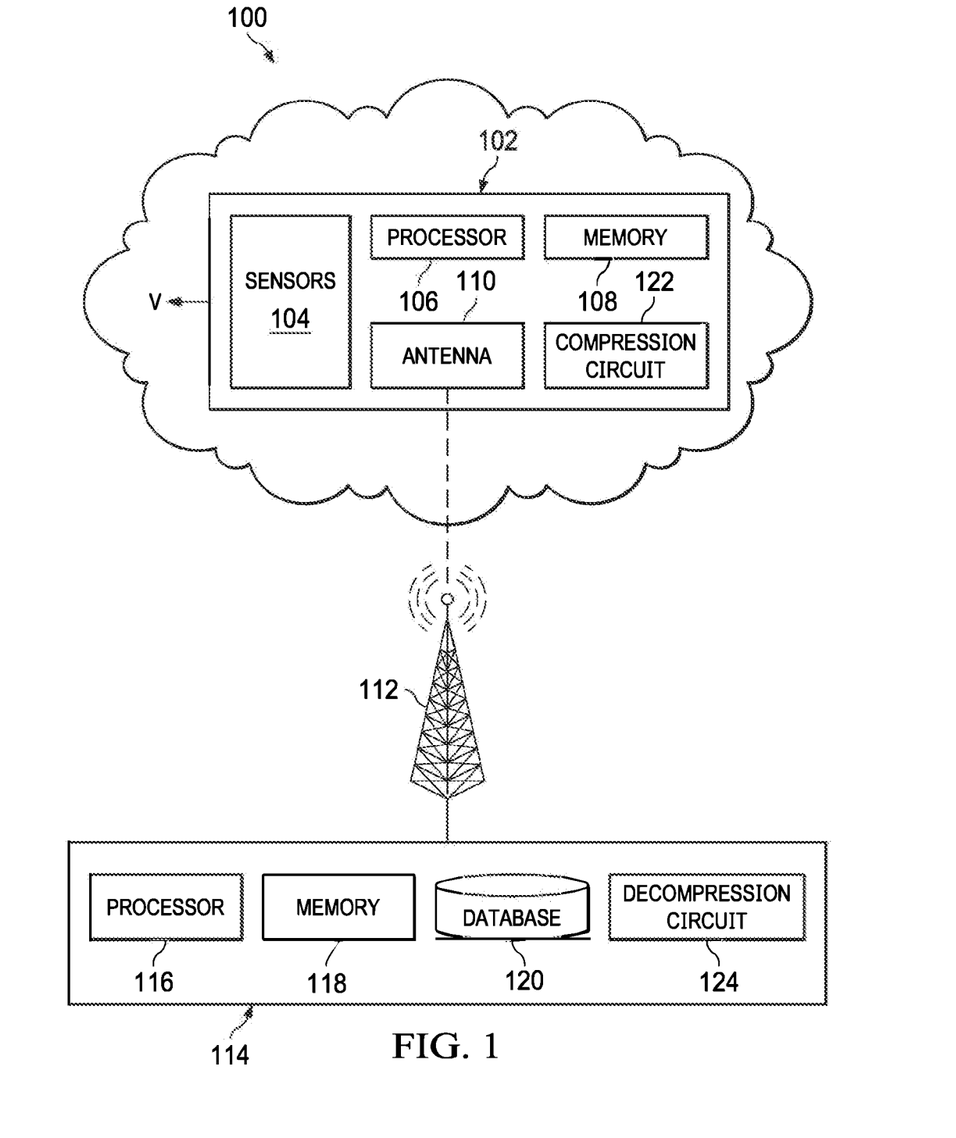
FIG. 1 is an illustration of an example system for performing point cloud compression, according to disclosed embodiments.

FIG. 1 is an illustration of an example system 100 for performing point cloud compression, according to exemplary embodiments. The point cloud compression may be performed live as the data for the point cloud is generated and collected. The point cloud compression may be performed before the data for the point cloud is to be recorded or sent to other elements for analysis and storage.

System 100 may include a device 102 and a server 114. Although shown separately and remotely communicatively coupled in FIG. 1, device 102 and server 114 may be co-located.

Device 102 may be configured to gather data about an environment. The data may be used to generate a point cloud. The data may be LiDAR data. The data may be generated while device 102 is moving through the environment. Device 102 may move through the environment with a given velocity or acceleration. Device 102 may be implemented in any suitable manner, such as by a transportation vehicle, robot, autonomous or semi-autonomous device, or aerial drone.

Server 114 may be configured to store point cloud data accumulated by device 102. Furthermore, server 114 may be configured to perform analysis on the point cloud data accumulated by device 102. Server 114 may be implemented in any suitable manner, such as by one or more computers, laptops, blade servers, system-on-a-chip, or other suitable electronic devices.

Device 102 may include sensors 104, one or more processors 106, one or more memories 108, and an antennae 110. One or more of sensors 104, one or more processors 106, one or more memories 108, and an antennae 110 may be further included in an assistive or automation system for device 102. Sensors 104 may be implemented by any suitable sensor such as an array of flash LiDAR sensors. Sensors 104 may be configured to perform measurements of object distances around device 102. Sensors 104 may be located on or in any suitable portion of device 102, such as rear, front, or side mirrors, or mounted to the roof, hood, trunk, or bumper of a transportation vehicle implementing device 102. Processors 106 may be implemented by microprocessors, microcontrollers, an application specific integrated circuit, a field programmable gate array, system on a chip, or any other suitable electronic device. Processors 106 may be coupled to and configured to receive sensor data from sensors 104 indicating data regarding the surroundings of device 102, such as data indicating the presence of one or more other transportation vehicles, pedestrians, or stationary or moving objects within the surroundings. Memories 108 may include long-term or short-term storage, including non-transitory memory. Antennae 110, although described as an antennae for wireless communication, may be implemented by any suitable mechanism for networked communications to send signals to server 114. In at least one disclosed embodiment, instead of or in addition to antennae 110, device 102 may include a local, portable storage medium (not shown). The signals that would have been sent via antennae 110 may instead be stored on the local storage medium. Later, the stored signals in the local storage medium may be transferred to another processor, system, or other device, such as server 114. Sensors 104 may be configured to issue a laser pulse for rays distributed across a three-dimensional projection aimed by different settings, and to record range and intensity information for the given ray that is returned to sensors 104.

It should be understood that the presently disclosed embodiments may be implemented using processors 106 which may run software stored in memories 108 for controlling the operations of device 102 disclosed herein so as to act as a plurality of data processing units or at least one unit that may be capable of processing different data processing tasks. For example, if sensors 104 are configured to measure more than one distance point for an object, the shape or an approximation of the shape of the object can be detected or approximated. Thus, in at least one implementation in which sensors 104 include a LiDAR sensor, high resolution information of the surroundings of device 102 may be collected.

In at least one disclosed embodiment, device 102 may include a compression circuit 122. Compression circuit 122 may be implemented by analog circuitry, digital circuitry, instructions stored in memories 108 for execution by processors 106, or by any suitable combination thereof. Compression circuit 122 may be configured to compress data and point clouds before transmitting the data to server 104.

It should also be understood that device 100 may include hardware and software in the processors 106 or elsewhere to provide the various levels of assistive or autonomous functionality described herein. To support or provide assistive or autonomous functionality, the disclosed embodiments prioritize data gathering and analysis using compressive active sampling, such as range sampling using LiDAR. With this improved sampling (e.g., gathering and analysis), the disclosed embodiments provide technical utility by improving operation of any transportation vehicle equipment for assistive and/or autonomous functionality by improving accuracy, speed of analysis and associated control of transportation vehicle operation.

Server 114 may include one or more processors 116, one or more memories 118, a database 120, and may include or be communicatively coupled to an antennae 112. Processors 116 may be implemented by microprocessors, microcontrollers, an application specific interface circuit, a field programmable gate array, system on a chip, or any other suitable electronic device. Memories 118 may include long-term or short-term storage, including non-transitory memory. Antennae 112, although described as an antennae for wireless communication, may be implemented by any suitable mechanism for networked communications to send and receive signals to and from device 102. In at least one disclosed embodiment, instead of or in addition to antennae 112, server 114 may be configured to receive a local, portable storage medium or contents thereof, including signals that would have been sent via antennae 110 and antennae 112. Database 120 may be implemented by a relational database, file, or any other suitable system or data structure. Server 114 may be configured to store results of processing point clouds, or the point clouds themselves, whether compressed or decompressed, in database 120.

In at least one disclosed embodiment, server 104 may include a decompression circuit 124. Decompression circuit 124 may be implemented by analog circuitry, digital circuitry, instructions stored in memories 118 for execution by processors 116, or by any suitable combination thereof. Decompression circuit 124 may be configured to decompress data and point clouds after receiving compressed data from device 102.

In the example implementations below, pseudocode may be used to illustrate functionality of compression or decompression of LiDAR data. The pseudocode may or may not be operational exactly as presented for any given programming language, compiler, or development environment. The pseudocode may be used to create software, or combinations of digital and analog circuitry in, for example, a field programmable gate array chip, application specific integrated circuit, or any other suitable hardware. The pseudocode presented may show one particular manifestation of the concepts described herein, but is provided as example only. It is the underlying concepts themselves which are to be considered the technical utility of the disclosed embodiments.

Figure 2:
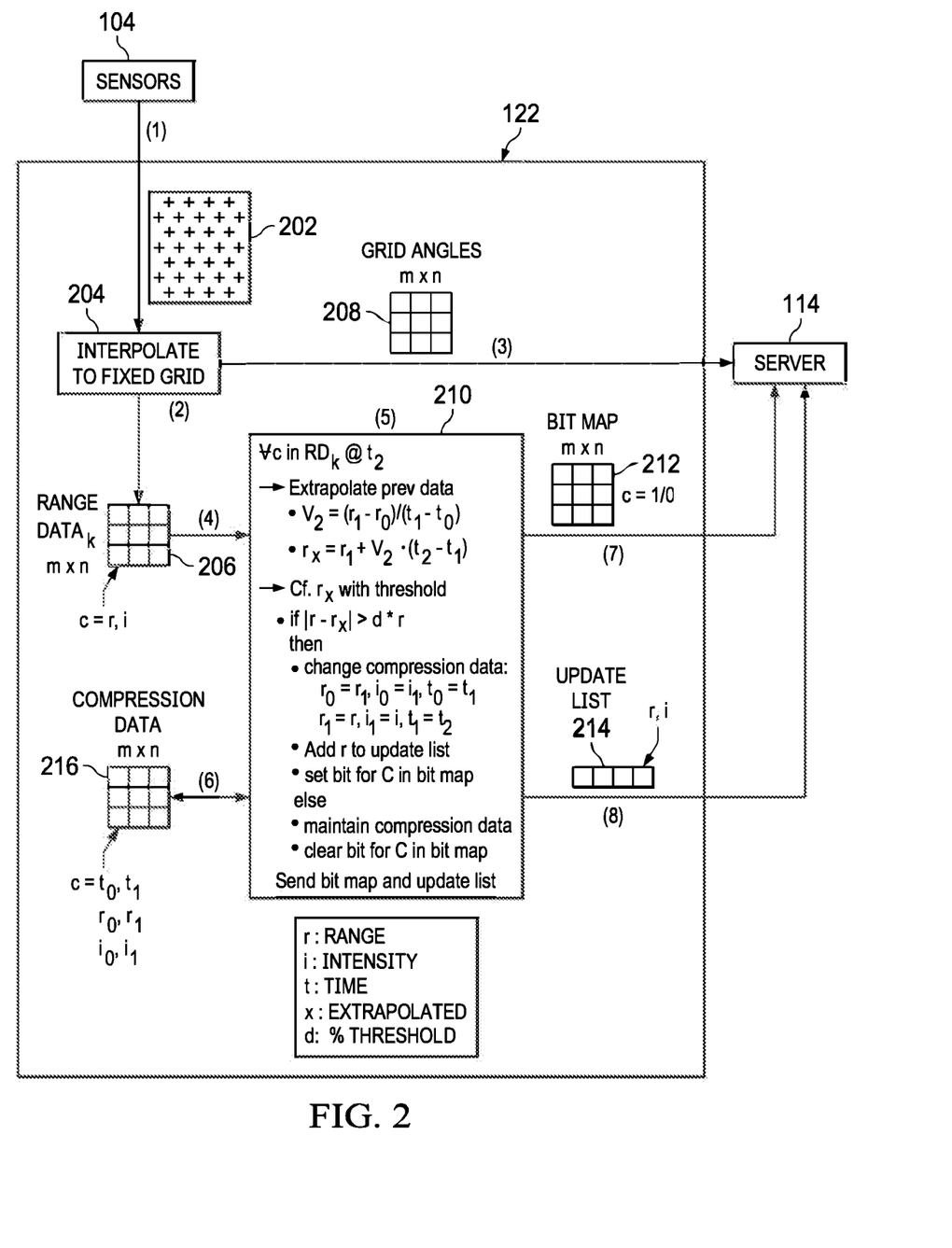
FIG. 2 is a more detailed illustration of the system of FIG. 1 including operation of a compression circuit, according to disclosed embodiments.

FIG. 2 is a more detailed illustration of system 100 including operation of compression circuit 122, according to disclosed embodiments.

At (1), sensors 104 may generate a data structure 202 of LiDAR data. Data structure 202 may be implemented by an array, file, or any other suitable data structure. Data structure 202 may represent one full scan of point cloud data generated by sensors 204. Furthermore, data structure may include any suitable additional information for the sensor or the point cloud, such as an identifier of the sensor, a data size of the point cloud, frame data such as a timestamp or and ego pose. Data structure 202 may include a two-dimensional array of cells, wherein each cell in the array represent one ray sampled along an angle in a three-dimensional view from sensors 104. For example, the ray may be emitted out from sensors 104 at an azimuth and an elevation angle as viewed from the origin of sensors 104. Data returned from the ray may indicate possible surface intersection points with the ray. Such data may be used to create a representation of the physical environment around sensors 104. The data may include, for example, range data indicating a distance of the object. The data may include, for example, intensity data indicating an intensity of a returned ray.

Some sensors 104 may sample along rays with fixed predetermined angles. However, other sensors 104 may have scan patterns that do not completely repeat. For such other sensors 104 that do not repeat in a predetermined pattern, such data may be interpolated into a grid that does include fixed cell angles. For example, at (2) an interpolation operation 204 may be performed. The interpolation operation may be performed by analog circuitry, digital circuitry, instructions for execution by a processor, or any suitable combination therein. Interpolation operation 204 may yield data structure 202 as converted into a fixed grid. This may introduce some error, but various techniques in the art may be used to minimize such an error. The fixed grid of input data from sensors 202 may be represented by range data (RD) 206. RD 206 may be generated for various moments in time. Moreover, a template of constant grid angles 208 may be generated by interpolation operation 204. At (3), the template of constant grid angles 208 may be sent to server 104.

The structure type used for RD 206 may be the expected form of input data to be compressed as well as the resulting output data which has been uncompressed. The structure may be defined in pseudocode as:

```
struct LidarFileStruct
{
  LidarHeader header; //small in size compared to array of ray data.
  struct LidarRaySample
  {
    float Azimuth; //in radians
    float Elevation;
    struct ReturnSample
    {
      float range; //in meters. 0 represents 'not set'
      float intensity; //typically 0-1.0, 2.0 for reflectors.
    } returns [ SizeR ] ; //SizeR = maximum returns per ray
  } rays[SizeY][SizeX];
};
```

As shown above, a given cell may include an azimuth defined in radians, and an elevation. Each cell may include a range, denoted in FIG. 2 as "r", and an intensity, denoted in FIG. 2 as "i". Each cell may also include a defined number of returns per ray (not shown in FIG. 2). The two dimensional array may be of a SizeY by SizeX in the pseudocode, illustrated as m×n in FIG. 2. For transmitting or storing compressed data, each ReturnSample in the pseudocode can be represented in 16-bit fixed point values, where for range values r up to 65535 centimeters (655 meters) may be represented, and intensity values i can be appropriately scaled to fit into 8 or 16 bits. Frame header information, such as LidarHeader, and the ray angles (defined by Azimuth and Elevation in the pseudocode, and as manifested by grid angles 208 in FIG. 2) might only need to be transmitted a single time or, may be transmitted on an infrequent basis (such as every 10 seconds) since these values do not change between instances of data collected from sensors 104. 32-bit floating point values may be used in the pseudocode for simplicity of description. The following pseudocode may be used to represent the storage of an individual cell:

```
struct NewCellData
{
  float r; //range, in meters
  float i; //intensity
}
```

Compression circuit 122 may include a data structure for compression data 216. Compression data 216 may include m by n cells, wherein each cell includes data of a past measurements of data from prior instances of range data 206 collected from sensors 104. The contents of compression data 216 may be used to identify projected values of r or i. Each cell of compression data 216 may include, for example, a prior instance of r, denoted as r1, a further prior instance of r, denoted as r0, a prior instance of i, denoted as i1, a further prior instance of i, denoted as i0, and time values at which respective r1, i1 and r0, i0 values were taken, denoted as t1 and t1.

At (4), RD 206 may be used as input into compression operation 210. Compression operation 210 may be performed by analog circuitry, digital circuitry, instructions for execution by a processor, or any suitable combination therein. Compression operation 210 may be performed for each cell in RD 206, and for respective r and i values of each such cell. The time may be given as t2. Compression operation 210 may assume that two previous instances of RD 206 were collected and recorded at times t0 and t1. The values for these previous instances of RD 206 may be stored in compression data 216.

At (5), extrapolation operation 210 may be performed. In at least one disclosed embodiment, extrapolation of previous data may be performed by first determining a velocity. The velocity may represent the velocity of device 102 (or of elements in the environment around device 102) between times t1 and t0. Thus, velocity v2 (at time t2) may be the quotient of the difference between r1 and r0 and the difference between t1 and t0. In another disclosed embodiment, given the determined velocity, v2, an extrapolated range value may be determined. The extrapolated range value may be a projected or estimated value of r that would occur if velocities remained constant. The extrapolated range value, rX, may be given as the value of r1 plus the velocity (v2) times the elapsed time (the difference between t2 and t1).

Next, the extrapolated range value, rX, may be compared against the actual range value to determine whether the data has followed the projection based on the determined velocity. The absolute value of the difference between rX and r may be compared with a threshold value. The threshold value may be defined in any suitable manner, such as a relative value or an absolute value. For example, the threshold value may be defined as a percentage (d) of the r value. Thus, if the difference between the extrapolated and actual values is greater than the defined percentage (d) of the r value, the projected value and the actual value of r are sufficiently different that the actual value of r will not be considered as following the projection. In at least one disclosed embodiment, in such a case, such a value of r should be provided to server 104. Otherwise, such a value of r might not be needed to be provided to server 104, and server 104 may instead simply use the projection of the value of r.

If the extrapolated range value rX and the actual range value are sufficiently different, then compression data 216 may be updated. This may result from the projection incorrectly identifying the extrapolated range value rX. Thus, the model for projecting further extrapolated range values may be adjusted by updating compression data 216. For example, r0 may be assigned the value of r1, i0 may be assigned the value of i1, r1 may be assigned the present value of r, i1 may be assigned the present value of i, t0 may be assigned the value of t1, and t1 may be assigned the value of t2.

Furthermore, in at least one disclosed embodiment the value of r and the value of i may be added to a structure that identifies elements of measured data that is to be sent to server 104 in uncompressed format. Any suitable structure may be used to package measured data from operation of compression operation 210. For example, an update list 214 may include a one dimensional array of cell values. The size of the array may be the number of measured value pairs that are to be transmitted uncompressed. Each cell may include, for example, an indication of r and i values. Each cell may also include a denotation (not shown) of the position of the r and i values in range data 206. In another disclosed embodiment, the position of the r and i values in range data 206 may be inferred as described below.

In at least one disclosed embodiment, a denotation of whether a given cell of range data 206 is compressed may be stored in a data structure. Any suitable data structure may be used. For example, bit map 212 may include m×n bit values. Each cell of bit map 212 may correspond to a cell in range data 206. A set bit in a given cell of bit map 212 may indicate that the corresponding values in range data 206 are not to be compressed. Such values will be sent to server 104 in, for example, update list 214. A cleared bit in a given cell of bit map 212 may indicate that the corresponding values in range data 206 are to be compressed. Such values might not be sent to server 104, and thus not appear in update list 214. The set and cleared bit functionality may be reversed according to design preference. Server 104 may be configured to process bit map 212 and, seeing that there is a cleared bit, may make its own inferences of the value of the corresponding cell in range data 206. If there is a set bit, server 104 may access update list 214 to retrieve the value of the corresponding cell in range data 206. Server 104 may access update list 214 in a predetermined order, such as from low index to high index, assuming that each newly found set bit in bit map 212, processed in order, corresponds to a next entry in update list 214.

Thus, if the extrapolated range value rX and the actual range value are sufficiently different, then a bit for the given cell may be set in bit map 212.

If the extrapolated range value rX and the actual range value are sufficiently the same, the compression data 216 may be maintained. Furthermore, a bit for the given cell may be cleared in bit map 212.

At (6), updated values may be stored, if needed, in compression data 216. At (7), bit map 212 may be sent to server 104. At (8), update list 214 may be sent to server 104.

The actions 1-8 may be repeated for each new set of sampled data from sensors 104. Some actions may be omitted in subsequent operations, such as action (3). Moreover, action (5) operation during a first two data sets may be truncated so as to store the values of each into compression data 216 and to send the values uncompressed to server 104.

Returning to the pseudocode, only data for ReturnSamples instances which cannot be inferred by propagation from previously transmitted data is transmitted for each new measured data, along with bit map 212 showing which data is present and which data must be inferred. In pseudocode, the this may be enumerated in terms of size by:

```
std::vector < NewCellData> newData;
const int NumBits = SizeY * SizeX * SizeR;
uint8_t newDataBits[NumBits/8];
```

Figure 3:
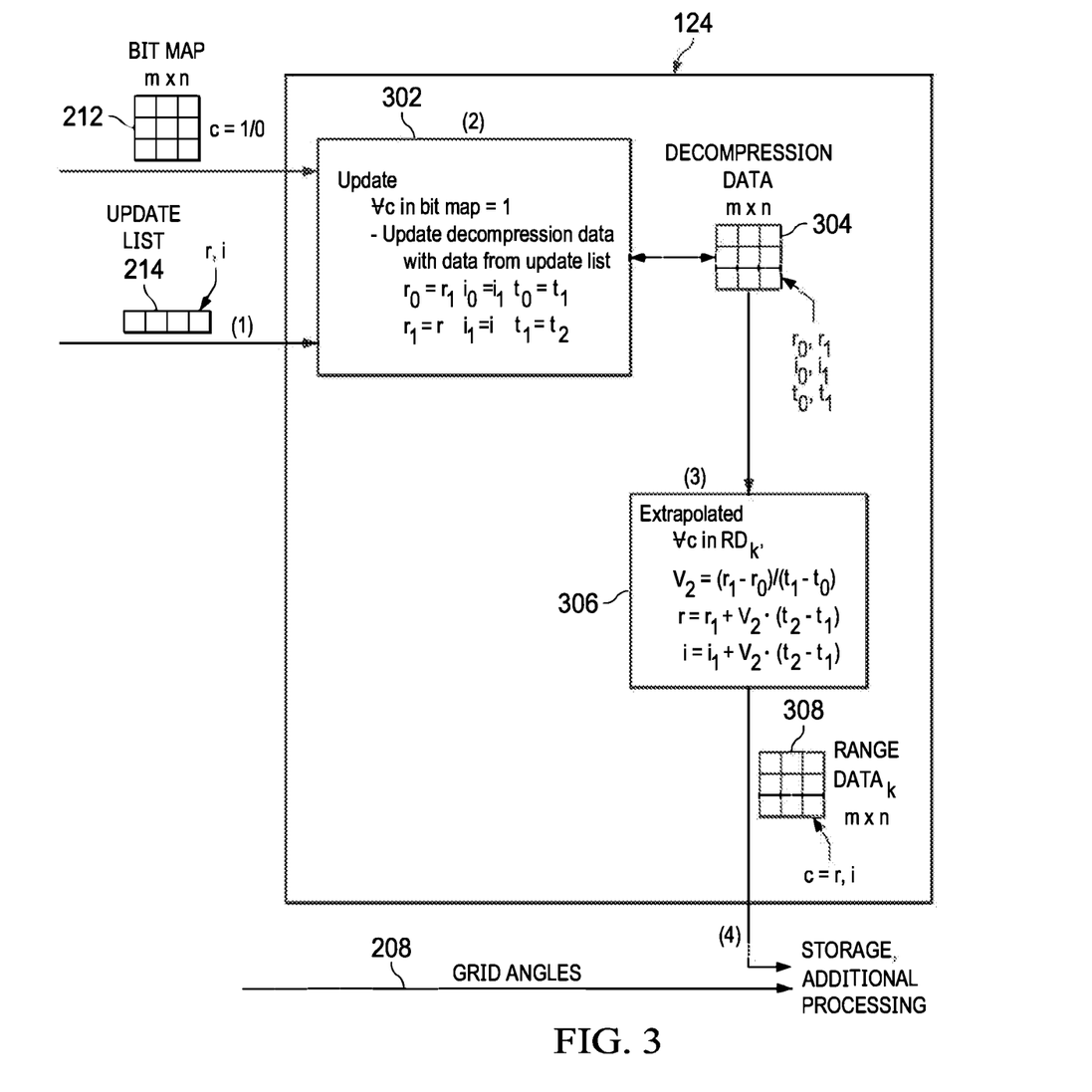
FIG. 3 a more detailed illustration of the system of FIG. 1 including operation of a decompression circuit, according to disclosed embodiments.

For both compression circuit 122 and decompression circuit 124, additional information may be kept for each cell. The information may indicate when the cell was last updated with newly transmitted data, and what that data was. This may be used for determining if new data to transmit can be represented by a propagation of previous data, as well as for propagating old data during decompression if new data was not received. This may be represented in pseudocode as:

```
struct CellData
{
    //t = time, r = range , i = intensity
    //1 = most recent, 0 = second most recent
    Microseconds t0; // 64-bit OTC time
    Microseconds t1;
    float   r0;
    float   r1;
    float   i0;
    float   i1;
};
//Both the compressor and decompressor need to keep a copy of this.
```

-continued

```
CellData compressCellData[SizeY][SizeX][SizeR];
CellData uncompressCellData[SizeY][SizeX][SizeR];
```

As discussed above, the threshold is used during compression to guarantee a certain level of quality. This threshold, such as d % in FIG. 2, should be set higher than the natural range noise level of sensors 104, so that this noise does not cause most of range data 206 to be transmitted every frame. This would defeat the purposes of compression. In another disclosed embodiment, a control loop can be used to adjust the threshold, to generally transmit data with a particular compression ratio. This may be represented in pseudocode as:

```
float CompressionThreshold = 0.1;
//Range noise of about 0.01 to 0.03 meters is typical.
void Compress(LidarFileStruct const& srcData)
//Clear all compressed data for frame, will set if sending.
memset(newDataBits, 0, sizeof(newDataBits));
newData.clear( );
```

During compression, for each ReturnSample in a new frame of data in an instance of range data 206, the extrapolated data may be created. This may be represented in pseudocode as:

```
for (int y = 0; y < SizeY; ++y)
for (int x = 0; x < SizeX; ++x)
for (int r = 0; r < SizeR; ++r)
{
ReturnSample const& newData = srcData.rays[y][x].returns[r];
NewCellData newCellData;
newCellData.r = newData.range;
newCellData.i = newData.intensity;
CellData & cellData = m_compressCellData[y][x][r];
}
```

If the new value of r is zero or near zero, the sample is empty wherein no data is available. If the last value of r was also zero, it might not be necessary to transmit it again. Otherwise, a new value of r will need to be transmitted, indicating that a previous sequence of r values has ended. This may be represented in pseudocode as:

```
if (newCellData.r <= 1)
{
if (cellData.r1 == 0) continue; //TXed 0 last time, don't do again.
newCellData.r = newCellData.i = 0;   //Must TX zero, loss of signal
}
```

Otherwise, if both of the last two samples of data that were transmitted were non-zero, it must be determined whether new data needs to be transmitted or not, based on if whether the new value of r is more than the threshold from the extrapolated value of r. This may be represented in pseudocode as:

```
//if either is zero, we have to transmit.
else if ((cellData.r1 != 0) && {cellData.r0 != 0))
{
//Extrapolate from last two ranges.
float timeRatio =  float(currentTime − cellData.t1) /
{cellData.t1 − cellData.t0);
float extRange = cellData.r1 + (cellData.r1−cellData.r0)*timeRatio;
```

-continued

```
//Scaling error by range, for more uniform distortion of scene.
float error= std::abs{newCellData.r − extrapRange)
    / newCellData.r;
//No need to TX anything, if the propagation is fine.
if (error < CompressionThreshold) continue;
//Otherwise, new range outside of threshold, needs update.
}
```

If the new data must be transmitted, the bit map 212 and update list 214 may be updated. This may be represented in pseudocode as:

```
CellData & cl= cellData;
    cl.t0    = cl.tl;
    cl.r0    = cl.rl;
    cl.i0    = cl.il;
    cl.tl    = currentTime;
    cl.rl    = newCellData.r;
    cl.il    = newCellData.i;
    newData.push_back{newCellData);
    SetBit(y,x,r); //sets the bit in newDataBits showing new data is sent.
```

Although the above examples use calculation of velocity, other calculations such as acceleration or jerk (change of acceleration) may be used to determine an extrapolated value of data. Moreover, although the above examples use two previous instances of data to calculate the extrapolation, any suitable number of previous instances of data may be used to calculate the extrapolation, such as 3, 4, or 5.

In some cases, a given laser pulse issued by sensors 104 may hit two or more objects. In such a case, part of the laser pulse may return from a first object and part of the laser pulse may return from a second object. In such a case, two sets of data may be returned for a given ray, pixel, or cell. Such additional sets may be described as echoes. Compression circuit 122 may be configured to select any suitable one, or an average of, or other mathematical operation of such echoes to determine which to compress. For example, each echo of range data may be compared to surrounding range data. The echo that is closest to the surrounding data may be selected to be evaluated for compression.

In at least one disclosed embodiment, a dropout may occur in data gathered by sensors 104. Such a dropout may include a ray for which no return data was received. For the purposes of compression, compression circuit 122 may handle such a ray with, for example, a new value of range data of zero, or a repeat of a previous value of range data such that the ray appears to follow the extrapolated projection.

In at least one disclosed embodiment, multiple echoes may be received by sensors 104 and each processed separately by compression circuit 122. In such an exemplary embodiment, bit map 212 may be implemented by multiple bits, wherein each bit represents possible compression of a differently enumerated echo for each cell. For example, if system 100 encounters three echoes for various rays, bit map 212 may include three bits, one each for each possible echo. Each separate echo may be handled as its own data range value and thereby evaluated, with the only difference being than an individual cell may have more than one possible set of data range values.

FIG. 3 a more detailed illustration of system 100 including operation of decompression circuit 124, according to disclosed embodiments. FIG. 3 illustrates a general process flow for live point cloud decompression. For decompression, compressed data will be accumulated and combined with previous data which has been propagated, to create a complete frame of range data.

Decompression circuit 124 may include a set of decompression data 304. Decompression data 304 may be implemented by any suitable data structure, such as a two-dimensional array of cells. The array may be m×n cells and may match the size of compression data 216. Decompression data 304 may include analogous data compared to compression data 216. Each cell of decompression data 304 may include values of r0, r1, i0, i1, t0, and t1. These may be values corresponding to previous sampled data from which presently sampled data may be extrapolated.

At (1), bitmap 212 and update list 214 may be received.

At (2), an update operation 302 may be performed by decompression circuit 124. Update operation 302 may be implemented by analog circuitry, digital, circuitry, instructions for execution by a processor, or any suitable combination thereof. In update operation 302, for every cell in bit map 212 that is set, a corresponding cell of decompression data 304 may be updated. Decompression data 304 may be updated with data from update list 214. Data from previous execution of the operations in FIG. 3 may be stored in decompression data 304. For example, r0 may be assigned the value of r1, r1 may be assigned the value of r (from the corresponding entry in update list 214), i0 may be assigned the value of i1, i1 may be assigned the value of i (from the corresponding entry in update list 214), t0 may be assigned the value of t1, and t1 may be assigned the value of t2 (the present time). For every cell in bit map 212 that is cleared, a corresponding cell of decompression data 304 may be maintained with the existing values therein.

At (3), an extrapolation operation 306 may be performed. Extrapolation operation 306 may be implemented by analog circuitry, digital, circuitry, instructions for execution by a processor, or any suitable combination thereof. For each cell in the range data to be reconstructed, v2 may first be determined as the quotient of the difference between r1 and r0 and the difference between t1 and t0, using values from a corresponding cell in decompression data 304. Then, r for a given cell may be determined by r1 plus v2 times the difference between t2 and t1. The value i for a given cell may be determined by i1 plus vi2 times the difference between t2 and t1. Vi2 may be given as the quotient of the difference between i1 and i0 and the difference between t1 and t0, using values from a corresponding cell in decompression data 304.

For cells in bit map 212 that were set, indicating that new r and i values are present in update list 214 and are not compressed, extrapolation operation 306 may simply use such new r and i values as received in update list 214 for entries in range data 308. Such an operation may be the same result as the determinations of extrapolation operation 306 described above. For example, in extrapolation operation 306 above, reliance may be made upon values in decompression data 304, which were updated in update operation 304. In particular, during update operation 304, t1 is assigned the value of the present time, t2. Moreover, r1 is assigned the value of r. Thus, in update operation 306, the calculation of $$r = r1 + V2*(t2-t1)$$

reduces to $$r = r1 + V2*(t2 - t2)$$

$$r = r1 + V2*(0) \quad r = r1$$

$$r = r$$

The calculations of r for cells in bit map 212 that were cleared, indicating that incoming data for the r and i values were compressed, may be performed as described above for extrapolation operation 306. Reliance may also be made upon values in decompression data 304. However, these values in decompression data 304 might not have been updated in update operation 304. The values may remain from previous executions of the operations in FIG. 3, such as update operation 302. Thus, during the calculation of r, the expression (t2–t1) might not be zero, as t2 is the present time while t1 is a time in the past. The resulting r value may be extrapolated based upon this time difference. Moreover, r1 and r0 might not need to be updated during update operation 302, and their values may be preserved. These older values of r1 and r0 may be accommodated-for in subsequent iterations through the expression (t2–t1), which may continue to use the older value of t1 associated with the older value of r1.

The data resulting from this processing of each cell may be a reconstructed version of the range data, denoted in FIG. 3 as range data' 308. Range data' 308 may be any suitable data structure, such as an m×n array of cells, wherein each cell includes the r and i values from various compressed and uncompressed cells. The data resulting from a processing of a cell At (4), range data' 308 and grid angles 208 may be provided to storage or to additional processing subsystems for use.

In the corresponding pseudocode, the loading of frame headers and lay angle data is not shown, but can be performed without decompression as these elements are either sent uncompressed or do not typically change between frames. The initial pseudocode for the decompression may be given as:

```
void Decompress(LidarFileStruct & dstData)
{
//as passed in the frame header.
Microseconds currentTime = dstData.header.timestamp;
int newDataindex = 0;
for (int y 0; y < SizeY; ++y)
for (int x 0; x < SizeX; ++x)
{
//Collect all extrapolated or received samples here.
std::vector<NewCellData> rangeSamples;
for (int r  0; r < SizeR; ++r)...
```

If new data for a given cell was received, as indicated in bit map 212, the new data may be loaded into the cell's information for future extrapolations and use. Older data may be rotated or cycled through, wherein the oldest data is discarded. Otherwise, the new range data will be used directly for the current frame's output. This may be represented in pseudocode as:

```
CellData & cellData uncompressCellData[y][x][r];
if (GetBit(y,x,r)) //determines if bit in newDataBits is set.
{
NewCellData & newCellData = newData[newDataindex++];
cellData.t0 = cellData.t1;
cellData.r0 = cellData.r1;
cellData.i0 = cellData.i1;
cellData.t1 = currentTime;
cellData.r1 = newCellData.r;
cellData.i1 = newCellData.i;
if (newCellData.r ! = 0)
rangeSamples.push_back(newCellData);
//Rxed new non-0 range continue;
}
```

Otherwise, extrapolate old data to add to the frame, if such old data is possible. This may be represented in pseudocode as:

```
if (cellData.r1 == 0) continue; //previous update had no range data.
if (cellData.r0 == 0) continue; //Can't extrapolate
float timeRatio = float(currentTime-cellData.t1)/ (cellData.t1-cellData.t0);
NewCellData rangeSample;
rangeSample.r = cellData.r1 + (cellData.r1 - cellData.r0) * timeRatio;
rangeSample.i = cellData.i1 + (cellData.i1 - cellData.i0) * timeRatio;
``` rangeSamples.push_back(rangeSample);

All extrapolated or received range samples for a given ray need to be sorted by range value r, so that the output is well ordered (increasing in range along a ray), as it was in the input data. This may be performed because extrapolations may have caused range values to change order. This may be represented in pseudocode as:

```
NewCellData tr;
std::vector<NewCellData> & rs  rangeSamples; int nr = rs.size( );
//In this example, SizeR = 3.
if ((nr > 1) && (rs[0].r> rs[1].r))
   {tr=rs[1]; rs[1]=rs[0]; rs[0]=tr;}
if ((nr > 2) && (rs[1].r > rs[2].r))
   {tr=rs[2] ; rs[2]=rs[1]; rs[1]=tr;}
if ((nr > 1) && (rs[0] .r > rs[1].r))
   {tr=rs[1]; rs[1]=rs[0]; rs[0]=tr;}
```

The data, now sorted, may be loaded into the uncompressed output structure of range data' 308. This may be represented in pseudocode as:

```
for (int r  0; r < SizeR; ++r)
{
auto & rat= dstData.rays[y][x].returns[r];
if (r >= rangeSamples.size( ))
ret.range= rat.intensity= 0;
else
  {
  ret.range = rangeSamples[r].r;
  ret.intensity = rangeSamples[r].i;
  }
}
```

It should be understood that the operations explained herein may be implemented in conjunction with, or under the control of, one or more general purpose computers running software algorithms to provide the presently disclosed functionality and turning those computers into specific purpose computers.

Moreover, those skilled in the art will recognize, upon consideration of the above teachings, that the above exemplary embodiments may be based upon use of one or more programmed processors programmed with a suitable computer program. However, the disclosed embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

Moreover, it should be understood that control and cooperation of the above-described components may be provided using software instructions that may be stored in a tangible, non-transitory storage device such as a non-transitory computer readable storage device storing instructions which, when executed on one or more programmed processors, carry out the above-described method operations and resulting functionality. In this case, the term non-transitory is intended to preclude transmitted signals and propagating waves, but not storage devices that are erasable or dependent upon power sources to retain information.

Those skilled in the art will appreciate, upon consideration of the above teachings, that the program operations and processes and associated data used to implement certain of the embodiments described above can be implemented using disc storage as well as other forms of storage devices including, but not limited to non-transitory storage media (where non-transitory is intended only to preclude propagating signals and not signals which are transitory in that they are erased by removal of power or explicit acts of erasure) such as, for example, Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies without departing from certain disclosed embodiments. Such alternative storage devices should be considered equivalents.

The present disclosure has been described in terms of one or more exemplary embodiments, and it should be appreciated that many equivalents, alternatives, variations, and modifications, aside from those expressly stated, are possible and within the scope of the disclosure as would be apparent to those skilled in the art in light of the present disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein. Accordingly, the various exemplary embodiments, as set forth above, are intended to be illustrative, not limiting. Various changes may be made without departing from the spirit and scope of the disclosure.

As explained in this disclosure, the disclosed embodiments enable the ability to use compression of point clouds. However, it should further be understood that disclosed embodiments may be utilized with other collections or accumulation of data gathered by any suitable sensors. Moreover, the compression may be able to be performed in addition to further compression based upon the same techniques on higher order information, such as acceleration. Thus, it should be understood that the presently disclosed embodiments have been explained in a way that clearly describes how previous instances of collected data may be used to create projection yielding a threshold of an expected new sample and, based on whether the new sample meets the threshold, determine whether the data point follows the projection and keep or discard the data accordingly.

For the purposes of this disclosure, the phrase "autonomous or assistive functionality" may include functionality that enables the partial, full or complete automation of control of various devices or systems, including transportation vehicles (where vehicular control encompasses what has presently come to be known as the five levels of driving automation), security systems, airplanes, trains, drones, and warehouse operations. Thus, it should be understood that autonomous or assistive functionality refers to operations performed by a transportation vehicle in an automated manner by on-vehicle equipment or the output of alerts, prompts, recommendations or directions to a user, wherein these outputs are generated in an automated manner by on-vehicle equipment. Moreover, autonomous or assistive functionality may include driver assistance functionality (level one) wherein on-vehicle equipment assists with, but does not control, steering, braking and/or acceleration, but a driver ultimately controls accelerating, braking, and monitoring of a transportation vehicle surroundings.

It should be understood, therefore, that such autonomous or assistive functionality may also include lane departure warning systems which provide a mechanism to warn a driver when a transportation vehicle begins to move out of its lane (unless a turn signal is on in that direction) on freeways and arterial roads. Such systems may include those that warn the driver (Lane Departure Warning) if the transportation vehicle is leaving its lane (visual, audible, and/or vibration warnings) and which warn the driver and, if no action is taken, automatically take steps to ensure the transportation vehicle stays in its lane (Lane Keeping System).

Likewise, autonomous or assistive functionality may include partial automation (level two), wherein the transportation vehicle assists on steering or acceleration functions and correspondingly monitoring transportation vehicle surrounding to enable a driver to disengage from some tasks for driving the transportation vehicle. As understood in the automotive industry, partial automation still requires a driver to be ready to assume all tasks for transportation vehicle operation and also to continuously monitor the transportation vehicle surroundings at all times.

Autonomous or assistive functionality may include conditional automation (level three), wherein the transportation vehicle equipment is responsible for monitoring the transportation vehicle surroundings and controls steering, braking and acceleration of the transportation vehicle without driver intervention. It should be understood that, at this level and above, the on-vehicle equipment for performing autonomous and/or assistive functionality will be interfacing with or include navigational functionality so that the components have data to determine where the transportation vehicle is to travel. At level three and above, a driver is theoretically permitted to disengage from monitoring transportation vehicle surroundings but may be prompted to take control of the transportation vehicle operation under certain circumstances that may preclude safe operation in a conditional automation mode.

Thus, it should be understood that autonomous or assistive functionality may include systems which take over steering, keep the transportation vehicle centered in the lane of traffic.

Likewise, autonomous or assistive functionality may include high automation (level four) and complete automation (level five), wherein on-vehicle equipment enable automated steering, braking, and accelerating, in response to monitoring of the surroundings of the transportation vehicle in an automated manner without driver intervention.

Therefore, it should be understood that autonomous or assistive functionality may require monitoring of surroundings of a transportation vehicle including the vehicle roadway as well as identification of objects in the surroundings so as to enable safe operation of the transportation vehicle in response to traffic events and navigational directions, wherein that safe operation requires determining when to change lanes, when to change directions, when to change roadways (exit/enter roadways), when and in what order to merge or traverse a roadway junction, and when to use turn signals and other navigational indicators to ensure other transportation vehicles/vehicle drivers are aware of upcoming transportation vehicle maneuvers.

Further, it should be understood that high and full automation may include analysis and consideration of data provided from off-vehicle sources to make determinations of whether such levels of automation are safe. For example, autonomous and/or assistive functionality at such levels may involve determining the likelihood of pedestrians in the surroundings of a transportation vehicle, which may involve referencing data indicating whether a present roadway is a highway or parkway. Additionally, autonomous or assistive functionality at such levels may involve accessing data indicating whether there is a traffic jam on the present roadway.

With this understanding of potential implementation of on-vehicle sensors for autonomous or assistive functionality in mind, presently disclosed systems, components, and methodologies may be provided to improve object detection and tracking in sampled data captured by sensors positioned on a transportation vehicle regarding the surroundings of transportation vehicle by improving, through compression, sampling (e.g., gathering and analysis) operations of any transportation vehicle equipment for assistive and/or autonomous functionality so as to improve accuracy, speed of analysis and associated control of transportation vehicle operation.

What is claimed is:

1. A system for point cloud data compression, the system comprising:
    at least one LiDAR sensor; and
    a compression circuit configured to:
        receive data for a plurality of rays from the LiDAR sensor, the data arranged in cells, the cells mapping to corresponding rays, each cell including at least a range value for a corresponding ray;
        construct a frame for the received data; and
        for each cell:
            determine a velocity associated with the range value for the cell;
            based upon the velocity, determine whether to compress the frame with respect to the cell; and
            selectively compress the frame with respect to the cell based on the determination of whether to compress the range value for the cell,
        wherein the compression circuit is further configured to determine a projected value for the range value for the cell using the velocity associated with the range value for the cell, and
        wherein the compression circuit is further configured to:
        compare the projected value for the range value with the range value; and
        based on the comparison, determine whether to compress the range value for the cell.

2. The system of claim 1, wherein the compression circuit is further configured to determine the velocity associated with the range value for the cell based upon two or more prior data samples of range values for the cell.

3. The system of claim 1, wherein the compression circuit is further configured to:
    determine to compress the range value for the cell based on a determination that the range value is not within a specified threshold to the projected value; and
    determine to not compress the range value for the cell based on a determination that the range value is within a specified threshold to the projected value.

4. The system of claim 1, wherein selectively compressing the range value for the cell includes omitting the range value for the cell from a data transfer.

5. The system of claim 1, wherein selectively compressing the frame with respect to the cell includes:
    constructing the frame with no data of the cell; and
    setting information indicating that the data of the cell is not included in the frame and is to be inferred by prior data.

6. A system for point cloud data decompression, the system comprising:
    an interface configured to receive a compressed data stream; and
    a decompression circuit configured to:
        generate a reconstructed frame of data from the compressed data stream, wherein:
            the reconstructed frame of data includes data for a plurality of rays generated by a LiDAR sensor;
            the data is arranged in cells;
            the cells map to corresponding rays; and
            each cell includes at least a range value for a corresponding ray; and
        for each cell:
            determine whether the compressed data stream indicates that the compressed data stream is compressed with respect to the cell;
            based on a determination that the compressed data stream indicates that the compressed data stream is compressed with respect to the cell, reconstruct the range value for the cell in the reconstructed frame based upon a velocity associated with the range value for the cell,
        wherein the decompression circuit is further configured to, based on a determination that the compressed data stream indicates that the compressed data stream is not compressed with respect to the cell, set the range value for the cell in the reconstructed frame with a received range value in the compressed data stream.

7. The system of claim 6, wherein the decompression circuit is further configured to determine the velocity associated with the range value for the cell based upon two or more prior data samples of range values for the cell.

8. The system of claim 6, wherein, for a given cell for which the compressed data stream indicates that the data stream is compressed with respect to the cell, the compressed data stream does not include data for the range value of the given cell.

9. The system of claim 6, wherein determining whether the compressed data stream indicates that the compressed data stream is compressed with respect to the cell includes determining from a mask whether the compressed data stream includes the range value of the cell.

10. A system for point cloud data decompression, the system comprising:
    an interface configured to receive a compressed data stream; and a decompression circuit configured to:
  generate a reconstructed frame of data from the compressed data stream, wherein:
    the reconstructed frame of data includes data for a plurality of rays generated by a LiDAR sensor;
    the data is arranged in cells;
    the cells map to corresponding rays; and
    each cell includes at least a range value for a corresponding ray; and
  for each cell:
    determine whether the compressed data stream indicates that the compressed data stream is compressed with respect to the cell;
  based on a determination that the compressed data stream indicates that the compressed data stream is compressed with respect to the cell, reconstruct the range value for the cell in the reconstructed frame based upon a velocity associated with the range value for the cell, wherein reconstructing the range value for the cell in the reconstructed frame includes:
  determining two or more prior data values for the cell;
  calculating the velocity based upon the two or more prior data values for the cell; and
  extrapolating a most recent data of the two or more prior data values for the cell based upon the velocity and a time at which the most recent data of the two or more prior data values was taken.

11. A method comprising:
receiving data for a plurality of rays from a LiDAR sensor, the data arranged in cells, the cells mapping to corresponding rays, each cell including at least a range value for a corresponding ray;
constructing a frame for the received data; and
for each cell:
  determining a velocity associated with the range value for the cell;
  based upon the velocity, determining whether to compress the frame with respect to the cell;
  selectively compressing the frame with respect to the cell based on the determination of whether to compress the range value for the cell;
  determining a projected value for the range value for the cell using the velocity associated with the range value for the cell; and
  comparing the projected value for the range value with the range value, and based on the comparison, determining whether to compress the range value for the cell.

12. The method of claim 11, further comprising determining the velocity associated with the range value for the cell based upon two or more prior data samples of range values for the cell.

13. The method of claim 11, further comprising:
determining to compress the range value for the cell based on a determination that the range value is not within a specified threshold to the projected value; and
determining to not compress the range value for the cell based on a determination that the range value is within a specified threshold to the projected value.

14. The method of claim 11, wherein selectively compressing the range value for the cell includes omitting the range value for the cell from a data transfer.

15. The method of claim 11, wherein selectively compressing the frame with respect to the cell includes:
constructing the frame with no data of the cell; and
setting information indicating that the data of the cell is not included in the frame and is to be inferred by prior data.

16. An article of manufacture comprising machine-readable instructions, which, when read and executed by a processor, cause the processor to perform the method of claim 11.

17. A method comprising:
receiving a compressed data stream;
generating a reconstructed frame of data from the compressed data stream, wherein:
  the reconstructed frame of data includes data for a plurality of rays generated by a LiDAR sensor;
  the data is arranged in cells;
  the cells map to corresponding rays; and
  each cell includes at least a range value for a corresponding ray; and
for each cell:
  determining whether the compressed data stream indicates that the compressed data stream is compressed with respect to the cell;
  based on a determination that the compressed data stream indicates that the compressed data stream is compressed with respect to the cell, reconstructing the range value for the cell in the reconstructed frame based upon a velocity associated with the range value for the cell, and
  based on a determination that the compressed data stream indicates that the compressed data stream is not compressed with respect to the cell, setting the range value for the cell in the reconstructed frame with a received range value in the compressed data stream.

18. The method of claim 17, wherein the decompression circuit is further configured to determine the velocity associated with the range value for the cell based upon two or more prior data samples of range values for the cell.

19. The method of claim 17, wherein, for a given cell for which the compressed data stream indicates that the data stream is compressed with respect to the cell, the compressed data stream does not include data for the range value of the given cell.

20. The method of claim 17, wherein determining whether the compressed data stream indicates that the compressed data stream is compressed with respect to the cell includes determining from a mask whether the compressed data stream includes the range value of the cell.

21. An article of manufacture comprising machine-readable instructions, which, when read and executed by a processor, cause the processor to perform the method of claim 17.

22. A method, comprising:
receiving a compressed data stream;
generating a reconstructed frame of data from the compressed data stream, wherein:
  the reconstructed frame of data includes data for a plurality of rays generated by a LiDAR sensor;
  the data is arranged in cells;
  the cells map to corresponding rays; and
  each cell includes at least a range value for a corresponding ray; and
for each cell:
  determining whether the compressed data stream indicates that the compressed data stream is compressed with respect to the cell;
  based on a determination that the compressed data stream indicates that the compressed data stream is compressed with respect to the cell, reconstructing the range value for the cell in the reconstructed frame based upon a velocity associated with the range value for the cell, wherein reconstructing the range value for the cell in the reconstructed frame includes:
- determining two or more prior data values for the cell;
- calculating the velocity based upon the two or more prior data values for the cell;
- extrapolating a most recent data of the two or more prior data values for the cell based upon the velocity and a time at which the most recent data of the two or more prior data values was taken.

23. An article of manufacture comprising machine-readable instructions, which, when read and executed by a processor, cause the processor to perform the method of claim 22.

\* \* \* \* \*